(12) United States Patent
Ke et al.

(10) Patent No.: US 10,591,325 B2
(45) Date of Patent: Mar. 17, 2020

(54) FLUID FLOW FEATURE IDENTIFICATION METHODS AND TOOLS

(71) Applicant: ROLLS-ROYCE plc, London (GB)

(72) Inventors: Yiping Ke, Singapore (SG); Jian Cheng Wong, Singapore (SG); Chi-Keong Goh, Singapore (SG); Kee Khoon Lee, Singapore (SG)

(73) Assignee: ROLLS-ROYCE plc, London (GB)

( * ) Notice: Subject to any disclaimer, the term of this patent is extended or adjusted under 35 U.S.C. 154(b) by 150 days.

(21) Appl. No.: 15/172,820

(22) Filed: Jun. 3, 2016

(65) Prior Publication Data
US 2016/0377462 A1     Dec. 29, 2016

(30) Foreign Application Priority Data

Jun. 29, 2015   (GB) .................................. 1511343.4

(51) Int. Cl.
*G01F 1/32*          (2006.01)
(52) U.S. Cl.
CPC .................................. *G01F 1/3209* (2013.01)
(58) Field of Classification Search
CPC .......................... G01M 10/00; G06F 17/5009
See application file for complete search history.

(56) References Cited

U.S. PATENT DOCUMENTS

| | | | |
|---|---|---|---|
| 2008/0015440 A1* | 1/2008 | Shandas | A61B 8/06 600/458 |
| 2010/0036648 A1* | 2/2010 | Mangalam | G06F 17/5009 703/2 |
| 2011/0144928 A1* | 6/2011 | Watanabe | G06F 17/5018 702/50 |
| 2011/0272032 A1* | 11/2011 | Varaksin | E04H 9/14 137/1 |

(Continued)

FOREIGN PATENT DOCUMENTS

| | | |
|---|---|---|
| EP | 2 068 262 A1 | 6/2009 |
| WO | 2005/024674 A1 | 3/2005 |

OTHER PUBLICATIONS

Pemberton et al., A Novel Method for Identifying Vortical Structures, 2002, p. 1051-1057.*

(Continued)

*Primary Examiner* — Mohammad K Islam
(74) *Attorney, Agent, or Firm* — Oliff PLC (57) ABSTRACT

A flow feature detection method is described. The method includes storing a plurality of points at locations over a region in which vortex detection is to be performed. A value for each of a plurality of fluid flow parameters, such as velocity, pressure and density, is determined at each point. The points are grouped as being contained in either a flow feature portion or normal flow portion of the region according to one or more statistical distribution for the fluid flow parameters. A point is identified as being indicative of the flow feature by identifying multiple further points at least (Continued)

partially surrounding the point, and determining a plane in which the flow feature is identifiable based upon the relative values of the one or more fluid flow parameter for the further points. The method may be used to detect vortices and to identify a two-dimensional plane representative of a vortex.

19 Claims, 4 Drawing Sheets

(56) References Cited

U.S. PATENT DOCUMENTS

| | | | |
|---|---|---|---|
| 2012/0139259 A1* | 6/2012 | Glezer | F03G 6/04 290/55 |
| 2014/0257772 A1* | 9/2014 | Perot | G06F 17/5009 703/2 |
| 2014/0350899 A1* | 11/2014 | Lu | G06F 17/5009 703/2 |
| 2015/0017385 A1* | 1/2015 | Lang | F15D 1/003 428/141 |
| 2015/0047352 A1* | 2/2015 | Glezer | F02C 1/05 60/641.8 |
| 2016/0140730 A1* | 5/2016 | Falahatpisheh | G01S 15/8984 382/131 |
| 2016/0153825 A1* | 6/2016 | Mangalam | G01P 5/01 73/1.16 |
| 2017/0199097 A1* | 7/2017 | Placko | G01M 9/065 |

OTHER PUBLICATIONS

Nov. 18, 2016 Search Report issued in European Patent Application No. 16 17 2873.

Wang, Yunhai et al., "Efficient Volume Exploration Using the Gaussian Mixture Model", IEEE Transactions on Visualization and Computer Graphics, Nov. 2011, vol. 17, No. 11, pp. pp. 1560-1573.

Jiang, Ming et al., "Geometric Verification of Swirling Features in Flow Fields", 2002 IEEE Visualization Proceedings, Oct. 27, 2002, pp. 307-314.

Levy, Yuval et al., "Graphical Visualiztation of Voritcal Flows by Means of Helicity", AIAA Journal, Aug. 1990, vol. 28, No. 8, pp. 1347-1352.

Berdahl, C. H. et al., "Eduction of Swirling Structure Using the Velocity Gradient Tensor", AIAA Journal, Jan. 1993, vol. 31, No. 1, pp. 97-103.

Jeong, Jinhee et al., "On the identification of a vortex", J. Fluid Mechanics, 1995, vol. 285, pp. 69-94.

Banks, David C. et al., "A Predictor-Corrector Technique for Visualizing Unsteady Flow", IEEE Transactions on Visualization and Computer Graphics, Jun. 1995, vol. 1, No. 2, pp. 151-163.

Sujudi, David et al., "Identification of Swirling Flow in 3-D Vector Fields", AIAA 12th CFD conf., Paper 95-1715, 1995, pp. 1-8.

Roth, Martin et al., "A Higher-Order Method for Finding Vortex Core Lines", Proceedings of the IEEE Visualization 98 (VIZ'98); 1998, pp. 1-8.

Strawn, Roger C. et al., "Computer Visualization of Vortex Wake Systems", AIAA Journal, Technical Notes, 1999, vol. 37, No. 4, pp. 511-512.

Dec. 22, 2015 Search Report issued in British Patent Application No. GB1511343.4.

Sadarjoen, I. Ari et al., "Geometric Methods for Vortex Extraction", Proceedings of the Joint Eurographics and IEEE TCVG Symposium on Visualisation, 1999, pp. 1-11.

Post, Frits H. et al., "Feature Extraction and Visualisation of Flow Fields", Eurographics, 2002, pp. 1-32.

* cited by examiner

FLUID FLOW FEATURE IDENTIFICATION METHODS AND TOOLS

BACKGROUND OF THE INVENTION

The present disclosure concerns methods and tools for identifying features of interest within a fluid flow.

The understanding of vortices/recirculations within fluid flows is an important engineering consideration, particularly, although not exclusively in the design of components or assemblies that are intended to interact with a fluid flow in use, i.e. so-called 'fluid-washed' components. This is especially the case for aerodynamic components, such as aerofoils, for which the efficiency of operation is dependent upon the manner in which the component affects the adjacent/surrounding fluid flow.

It is an engineering aim to be able to locate vortices accurately. The presence of a vortex on or adjacent a surface of a fluid-washed component can reduce aerodynamic efficiency and potentially cause other abnormal machine behaviour or even failure. Whilst it is possible to test physical components and flow regimes using conventional equipment such as wind tunnels and the like, there is a general trend, as in other areas of engineering, towards the use of computational modelling of fluid flow. Such computational techniques allow a deeper understanding/analysis of flow regimes and also allow changes to designs and test conditions to be implemented quickly and cost-effectively, thereby increasing the ability to experiment with alterations.

The inventor has assessed a number of different computational techniques for identifying vortices in a fluid flow as identified below:

Graphical Visualization of Vortical Flows by Means of Helicity (Y. Levy, D. Degani, and A. Seginer. AIAA J., 28(8):1347-1352, 1990) suggests identifying vortices using helacity, which is defined as the cosine of the angle between velocity v and vorticity w. The underlying assumption of the algorithm is that, near vortex core regions, the angle between v and w is small, which corresponds to a big helicity value. The detection algorithm locates points with maximum helicity values and traces streamlines from these maximum points.

Education of Swirling Structure using the Velocity Gradient Tensor (C. H. Berdahl and D. S. Thompson. AIAA J., 31(1):97-103, 1993) defines a swirl parameter $\tau$ based on the existence of complex eigenvalues in velocity gradient tensor J, as given by the following equation:

$$\tau = \frac{|\text{Im}(\lambda_C)|L}{2\pi|v_{conv}|},$$

where $\text{Im}(\lambda_C)$ is the imaginary part of the complex conjugate pair of eigenvalues of J, L is the characteristic length associated with the size of the region of complex eigenvalues $R_C$, and $v_{conv}$ is the convection velocity aligned along L. The basic idea of the detection algorithm is that, $\tau$ is non-zero in regions containing vortices and achieves a local maximum at vortex core.

On the Identification of a Vortex (J. Jeong and F. Hussain. J. Fluid Mechanics, 285:69-94, 1995), the velocity gradient tensor J is decomposed into its symmetric part S, and its anti-symmetric part $\Omega$. That is, $S=(J+J^T)/2$; and $\Omega=(J-J^T)/2$. The vortex is defined as a connected region where two of the three (real) eigenvalues of the symmetric matrix $(S^2+\Omega^2)$ are negative. Thus, if the second highest eigenvalue $\lambda_2$ of $(S^2+\Omega^2)$ is negative at a point, then the point belongs to a vortex.

A Predictor-Corrector Technique for Visualizing Unsteady Flow (D. C. Banks and B. A. Singer. IEEE Trans. Visualization and Computer Graphics, 1(2): 151-163, 1995) defines vorticity w as the curl of velocity v, which represents local flow rotation in terms of both speed and direction. This technique requires that vortices are sustained by pressure gradients and indicated by vorticity. Therefore, the algorithm detects vortex core lines by tracing vorticity lines (seeded with points that are of low pressure and high vorticity magnitude) and then correcting the detected lines based on local pressure minimum.

Identification of Swirling Flow in 3D Vector Fields (D. Sujudi and R. Haimes. In AIAA $12^{th}$ CFD conf., Paper 95-1715, 1995) uses an eigenvector method, the underlying assumption being that the eigenvalues and eigenvectors of the velocity gradient tensor J, evaluated at a critical point, define the local flow pattern about that point. The algorithm thus searches for points where J has one real and two complex conjugate eigenvalues. If the eigenvector of the real eigenvalue is parallel to the velocity vector, then the point is determined to be part of the vortex core.

A Higher-Order Method for Finding Vortex Core Lines (M. Roth and R. Peikert. In IEEE Visualization '98, pages 143-150, 1998) uses higher-order derivatives of velocity v to detect vortex core lines. It is observed that the eigenvector method is equivalent to finding points of zero torsion. Thus, the second-order derivative w of v is computed and a vortex core line consists of the points where v is parallel to w.

Computer Visualization of Vortex Wake Systems (R. C. Strawn, D. N. Kenwright, and J. Ahmad. AIAA J., 37(4): 511-512, 1999) defines a vortex core as being a local maximum of vorticity magnitude $|\omega|$ in the plane normal to $\omega$. This method is designed specifically to detect multiple vortices in close proximity with the same orientation and overlapping cores.

The above-described techniques share a common theme that the definition of a vortex is based upon each author's own specific understanding or observation of what properties constitute, and therefore define, a vortex. Such diverse vortex definitions leave open the possibility that any one definition could identify or overlook a vortex where another definition does not. Accordingly, the prior art techniques are subjective in nature.

For most of the prior art techniques, there exists a problem that false positive vortex identifications are generated, i.e. where detected core lines or regions do not actually contain vortices. This can thus lead to errors or else an increase in post-processing efforts in order to verify the correctness of detected vortices by either manual visualization or designing feature verification algorithms, the verification accuracy of which may also be uncertain.

Some techniques can also generate false negatives, where vortices do exist but are not detected. The false negative problem is difficult to guard against since it is not straightforward to identify where or why vortices are missing using conventional techniques.

Some of the techniques require users to specify thresholds for algorithm parameters in order to achieve best performance of the algorithms and, accordingly, there is margin for significant error due to the level of skill of the operator. Even for a skilled operator, it is not a straightforward task to ascertain the best thresholds and so another vortex detection technique may need to be used in order to validate/check the generated results.

Furthermore there is a significant technical challenge in identifying the presence and location of vortices since computational fluid dynamics (CFD) data typically comprises a huge number of data points to approximate/model a flow region. The computational power and time required to assess every data point in the flow region is prohibitive and so there is a need to accurately identify vortices without incurring such a high computational burden.

It is an aim of the present invention to provide for flow feature identification in a manner that substantially avoids or mitigates one or more of the above problems.

It may be considered an aim of the invention to provide a more effective flow feature locating technique.

BRIEF SUMMARY OF THE INVENTION

According to a first aspect of the invention there is provided a flow feature detection method comprising identifying a plurality of points at locations over a three-dimensional flow region in which flow feature detection is to be performed, storing for each point a value for one or more fluid flow parameter, grouping the points as being contained in a flow feature portion or a remaining portion of the flow region according to the values of said one or more fluid flow parameter, identifying a point within the flow feature portion and a plurality of further points at least partially surrounding said point, and determining a plane in which a flow feature is identifiable based upon the relative values of at least one of the one or more fluid flow parameter for the plurality of further points.

The method may result in outputting the plane in which the flow feature is identifiable. The ability to automatically capture the plane in which the flow feature resides is particularly beneficial in not only locating the flow feature but also analysing it, for example by reducing a complex three-dimensional problem to a simpler two-dimensional analysis.

The analysis of the relative fluid flow parameter values may advantageously be used to identify the plane in which the flow feature is best characterised, e.g. the plane in which the flow behaviour is strongest. This is useful in accurately locating and/or assessing the flow feature.

The points may comprise data points, for example within a computational model of the flow region.

The plane may be determined as the plane through the flow feature portion for which the first and further points display the greatest variation in values of the one or more flow parameter. The value of the flow parameter for the first point may be subtracted from the value of the flow parameter for each further point. The parameter may be a velocity vector, such as a relative velocity vector.

A statistical analysis of the flow parameters for the further points may be performed to identify the plane. Principle component analysis may be used.

The angular orientation of the plane within the flow region may be determined and/or output. In contrast to methods which apply planes at regular spacing and/or predetermined orientation in order to discretize a flow domain, the invention allows a 'best plane' to be selected. The selected plane can be used to characterise the flow feature accurately and/or with greater relevance to other flow features. Further analysis of the flow features can also be performed in the two-dimensional space of the plane once identified.

The grouping the points as being contained in a flow feature portion or a remaining portion of the flow region may be performed according to a statistical analysis of the values of said one or more fluid flow parameter.

The method may involve, for a first point contained in a flow feature portion, identifying the plurality of further points surrounding, or partially surrounding, said first point. The plurality of further points may be neighbouring and/or adjacent the first point. The plurality of further points may or may not represent an array of the closest further points in the flow region to the first point. Each further point in the array may be selected so as to be approximately equidistant from the corresponding first point.

The plurality of further points may comprise at least six or eight points. The plurality of further points may be substantially equally spaced (e.g. angularly) about the first point.

The method may comprise determining and/or outputting the location of a flow feature, for example within the determined plane. The location may or may not be determined according to a centre or core of the flow feature.

The plurality of further points may comprise a two and/or three-dimensional array of points centred about the first point (e.g. depending on whether the further points are identified in the three dimensional flow feature portion or the two-dimensional plane). A 3D array, e.g. a first array, of further points may be used to identify the plane. A 2D array, e.g. a second array, of further points may be used to identify the location of the flow feature within the plane.

The direction of motion of said further points may be determined, for example by way of a velocity vector or velocity angle within the plane. The change in velocity angle or direction between each further point and an adjacent further point may be determined. An aggregate or summation of the sequential changes in angle or direction between each successive further point about the first point may be determined. If the summation meets or exceeds a predetermined threshold value, the first point may be identified as lying in a vortex core. The threshold value may be 340°, 350° or substantially 360°.

The changes in angle between adjacent further points may be determined in a common sense, e.g. clockwise or anti-clockwise.

The method performed in respect of the first point may be repeated for a plurality or all points in the flow feature portion, e.g. in 3D or in the plane. The method may or may not terminate when the plane is determined or when a point is found to lie at a centre of the flow feature.

The method of flow feature detection is particularly robust and accurate, avoiding the need for experts to manually input parameters for guiding flow feature detection according to domain knowledge. Furthermore the method of flow feature detection is a fully data-driven approach, avoiding subjective vortex definitions and, instead, using data analytics to generate objective vortex, or other flow feature, identification results. Whilst the method of the invention was developed with the aim of capturing recirculating/vortical flow phenomena, it has been found that the invention is surprisingly well suited to capturing a wider variety of flow phenomena, such as points of flow stagnation or significant changes in flow direction/velocity or pressure, and thus that the invention may be used to identify and/or locate any flow features of potential interest in the modelled flow region.

The method may group the points according a model corresponding to a probability distribution, e.g. a mixture distribution/model, for said fluid flow parameters. A clustering algorithm or procedure may be used. A Gaussian mixture model may be used.

The flow parameters may be distributed according to a mixture of components, with each component belonging to a common parametric family of distributions, but for example having with different distribution parameters. The mixture model may comprise a set of mixture weightings, each of which may be a probability, for example, all of which sum to one.

The one or more flow parameter may be a directional/vector parameter. The flow parameter may comprise flow velocity and/or one or more component thereof in any or any combination of orthogonal directions. The flow parameters may comprise any or any combination of pressure, temperature and/or velocity.

The method may comprise determining the value of each of said fluid flow parameters at each of the points. The determination of said fluid flow parameters may be made for example using a computational fluid dynamics tool, e.g. according to conservation of mass, energy and/or momentum at multiple points within the flow region under analysis. A mesh may be applied to the region, thereby defining adjoining spatial elements covering the region, for example such that the mesh represents the interfaces between the elements. The points may be defined at the nodes of the mesh and/or at the centre of the elements.

The method may comprise a method of designing or modifying the geometry of a fluid washed component, whereby the fluid flow region is defined as a region containing or adjacent to the surface of the component. The method may or may not comprise determining whether a flow feature location is identified which impinges on the component surface. The method may comprise modifying the component surface geometry to cause an identified flow feature to move away from the surface.

The method may be performed for a first component geometry and repeated for a further, or modified, component geometry. The results may be compared, such as by comparing the plane, the flow feature location and/or a characteristic of the flow feature within the plane so as to assess an impact of the further/modified component geometry on the flow feature.

A vortex and/or vortex core may be identified using the invention under steady state or transient flow conditions.

The method may comprise a computer implemented method.

According to a second aspect of the invention, there is provided a data carrier comprising machine readable instructions for the control of one or more processor to perform the method of the first aspect.

According to a third aspect of the invention, there is provided a vortex detection tool comprising a data store on which is stored location data for a plurality of points over a three-dimensional fluid flow region in which vortex detection is to be performed and a plurality of fluid flow parameter values at each of said points, the tool further comprising one or more processor arranged group the points as being contained in a vortical flow portion or non-vortical flow portion of the flow region according to the values of said fluid flow parameters, and to identify a first point in a vortex core and a plurality of further points at least partially surrounding said point, wherein the one or more processor determines a plane in which a flow feature is identifiable based upon the relative values of at least one of the one or more fluid flow parameter for the plurality of further points.

Any of the essential or preferable features defined in relation to any one aspect of the invention may be applied to any further aspect. Accordingly the invention may comprise various alternative configurations of the features defined above.

BRIEF DESCRIPTION OF THE DRAWINGS

Practicable embodiments of the invention are described in further detail below by way of example only with reference to the accompanying drawings, of which.

DETAILED DESCRIPTION OF THE INVENTION

Figure 1:
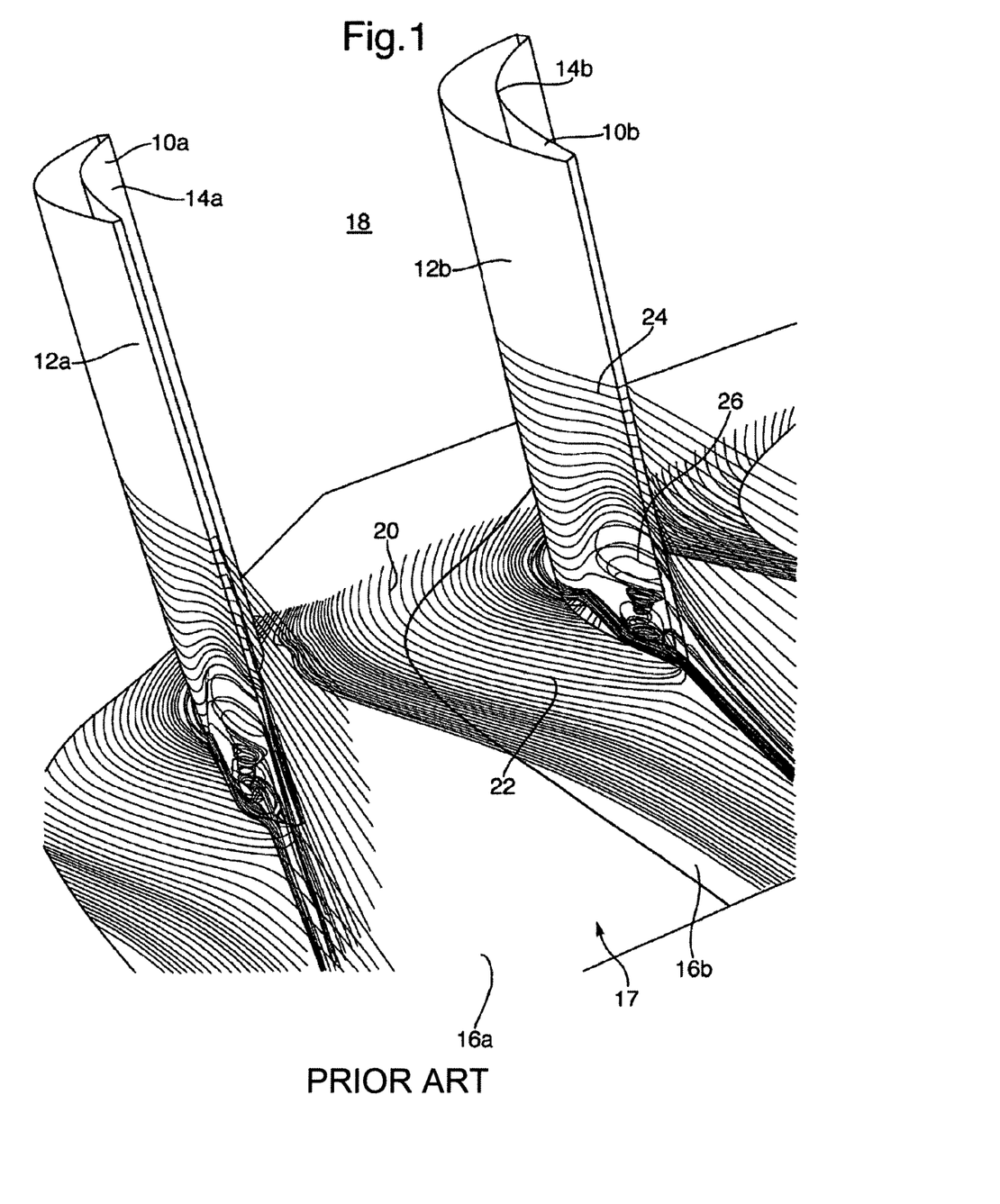
FIG. 1 shows a three-dimensional view of fluid flow over adjacent aerofoils according to the prior art.

FIG. 1 shows the results from a Computational Fluid Dynamics (CFD) simulation of the flow in a simple linear cascade of compressor blade rows for a gas turbine engine. Two adjacent aerofoils (10a, 10b) are shown, each having a suction surface (respectively 12a, 12b) and a pressure surface (14a, 14b). A platform (16a, 16b) is associated with each aerofoil (10a, 10b), the platforms (16a, 16b) being radially inward of the aerofoils and together defining an end wall 17. A flow passage (18) is defined by the surfaces 14a, 17 and 12b and by a shroud surface (not shown) radially outward of the aerofoils (10a, 10b). The model is viewed from the rear (from downstream looking upstream). Streamlines show the flow patterns on the end wall (17) and on the aerofoil suction surface (12b) for the lower half of the passage). The inlet main stream flow (20) is at the design incidence and velocity and shows a series of streamlines with no recirculation.

The over-turning of the fluid at the bottom of the inlet boundary layer is visible in the streamlines (22). This causes the airflow to impinge onto the suction surface (12b) of the aerofoil. On the aerofoil, near mid-height, the flow lines (24) generally follow the profile of the aerofoil surface. However, nearer the end wall (17), the streamlines on the aerofoil indicate a region of vortical flow (26), which causes separation of the boundary layer flow from the aerofoil. Vortex formation of this kind, adjacent the gas-washed surface of an aerofoil, or any other kind of aerodynamic component, causes flow efficiency losses. Accordingly it is desirable to be able to study flow regimes using a computational model to assess the suitability of different component geometries under relevant flow conditions. It is typically desirable to avoid vortex formation or else, if this is not possible, to ensure that a vortex is formed away from the component surface in order to improve aerodynamic efficiency. The preferred or optimal design of a fluid washed component may be taken forward for manufacture of a corresponding product or else for further engineering analysis, i.e. such that more detailed study of only a limited subset of the most promising designs/geometries is performed.

Figure 2:
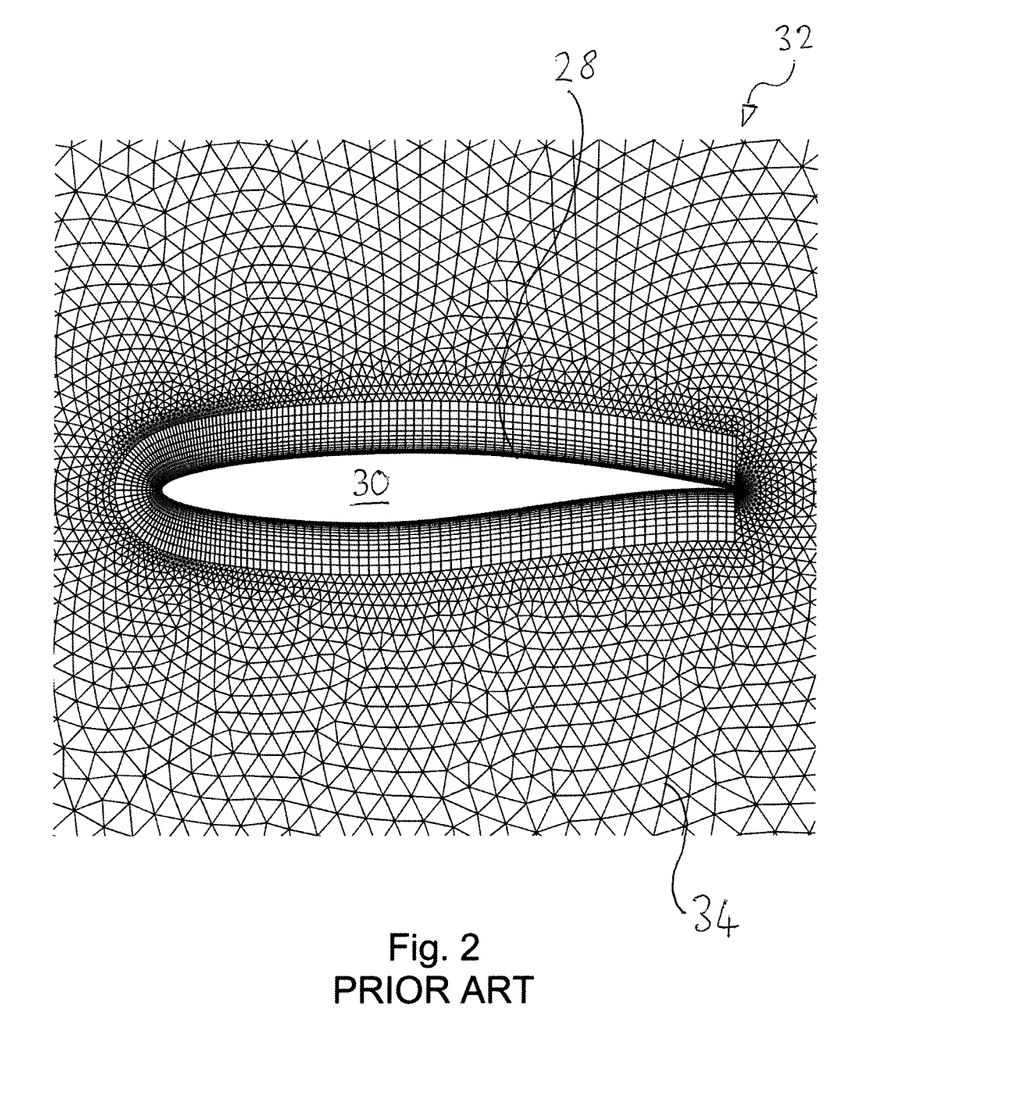
FIG. 2 shows a two-dimensional view of a meshed region of fluid flow about an aerofoil.

In this invention, an effective technique for detecting vortices from 3D computational fluid dynamics (CFD) data is proposed. Using conventional CFD tools or other computer aided design/engineering tools, it is possible to define the outer surface geometry 28 of a body 30 as shown in FIG. 2. The geometry may be saved on a computational memory device as a model or computational representational of a component or assembly, or a portion thereof.

A region of study 32 is defined in this example as area volume around the body 30. In order to be able to determine fluid flow parameters of the flow about the body 30 a mesh 34 is applied to the region of flow 32 about the body 30. The mesh comprises a number of adjoining cells, thereby defining corresponding points throughout the mesh, either at the adjoining corners/nodes of the cells or else at the centre of each cell, depending on the relevant definition. Whilst a plane through the 3D flow volume of interest is shown in FIG. 2 for clarity, it will be appreciated that the mesh 34 is in fact three-dimensional and extends in a direction out of the plane of the page in FIG. 2. Each cell thus represents a volume of the fluid flow region under analysis. Different types/shapes of cells may be used (e.g. including any or any combination of triangular pyramidal, i.e. tetrahedral, pyramids, wedges and/or hexahedral cells) as necessary. Various 'meshing' techniques will be known to the skilled person and may be matched to suit the flow regime under consideration. In particular, hybrid meshes, i.e. containing a plurality of different cell types/shapes may be used to mesh different regions of the flow field due to different expected flow regimes or complex geometry.

In order to determine the relevant flow parameters at the points throughout the region 32, initial boundary conditions for the parameters are set and the flow parameters are calculated at each point using conventional algorithms, typically including equations for conservation of mass, energy and momentum. The algorithms iteratively converge to a resolved solution and the data output from the CFD comprises a record of each of the calculated flow parameters for the location of each point within the region of study 32.

Figure 4:
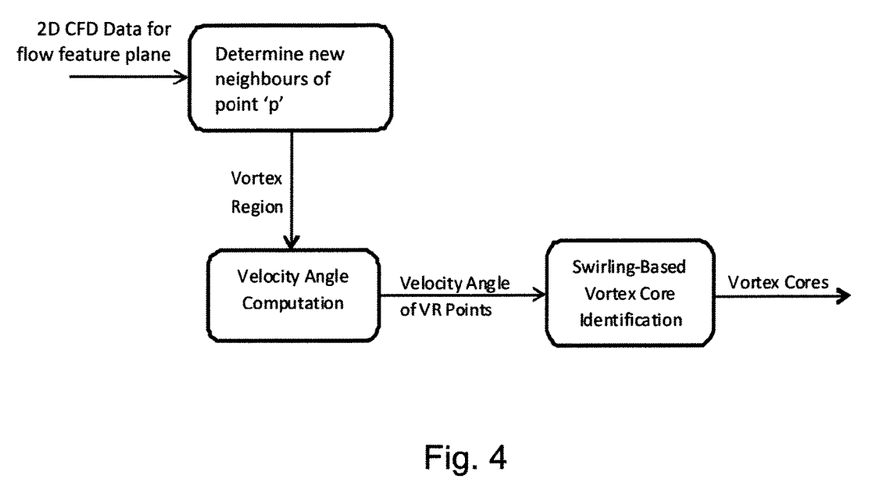
FIG. 4 shows a flow feature location or characterisation technique according to an example of the invention.
Figure 5:
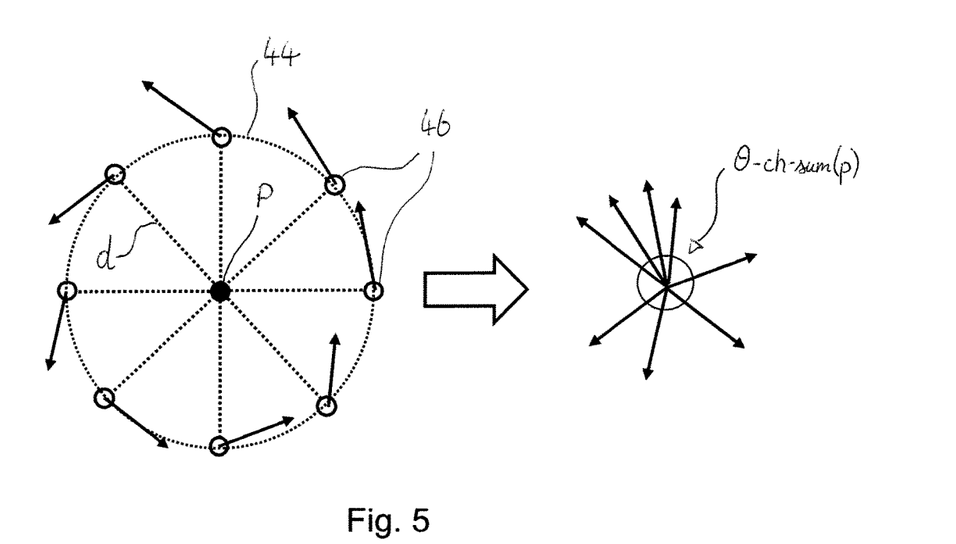
FIG. 5 shows further detail of an example of process for identifying a vortex core according to an example of the processes of FIG. 3 or 4.

This three-dimensional CFD output, typically provided as one or more data file, is then processed using one or more computational device in a manner according to the invention as will be described below with reference to FIGS. 3 to 5.

Figure 3:
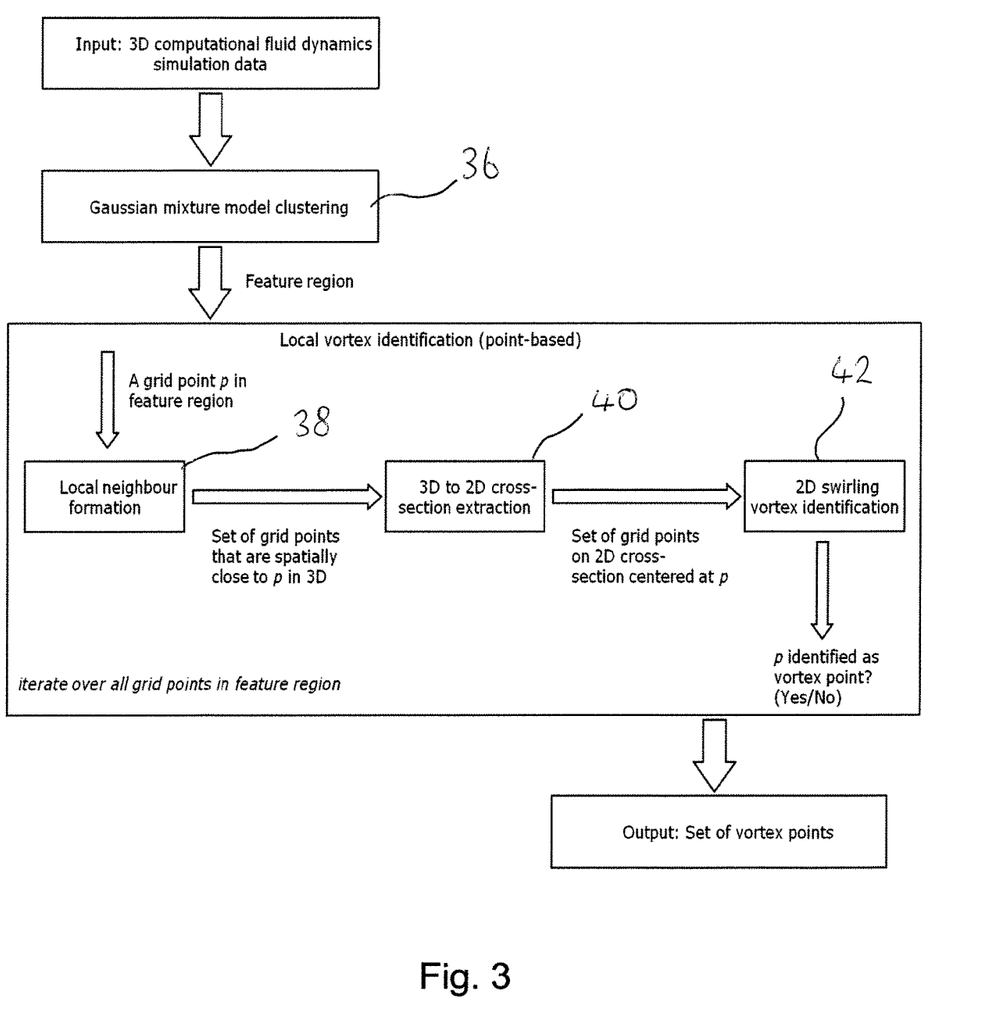
FIG. 3 shows the stages of a flow feature identification technique according to one example of the invention.

As shown in FIG. 3, upon receiving the CFD data the proposed technique for flow feature identification consists of four stages, each of which may be enacted as a separate module or groups of modules, as follows:
(1) Flow feature region separation 36;
(2) Local neighbouring point formation 38;
(3) 3D to 2D plane extraction 40;
(4) Flow feature identification/characterisation 42.

The processes listed above may be carried out sequentially, e.g. in the order shown. However any sub-processes thereof may operate in parallel where possible.

The flow feature region separation module 36 is responsible for separating one or more region containing a flow phenomenon of interest from a remaining or 'normal' region in the full flow field (i.e. the region of study). Herein, vortex region (VR) refers to the region in which one or more vortices are observed, while non-vortex region (non-VR) contains no vortices. The following description proceeds in relation to the specific example of vortex identification, although the same techniques will also identify other flow features of interest, i.e. in which there is a significant departure from 'normal' or free stream flow conditions. The term 'vortex' and 'vortical' could thus be substituted herein for 'flow feature' or 'abnormal' within the following description.

The module 36 takes the raw CFD data as input. This typically comprises the location of each point in the flow region as well as the relevant flow parameter values at each point as discussed in further detail below. The CFD data may also comprise cell data.

A model-based machine learning technique is used to group the data points into VR or non-VR groups using probability distribution analysis. In this example a mixture model, in particular a Gaussian Mixture Model (GMM), is used to cluster the input data points into VR and non-VR. However a Gaussian distribution represents only one example of a suitable parametric family of distributions, i.e. defined according to a mean and variance, and it is possible that a mixture model involving other parametric families could be used, assuming good correlation between a particular model and the flow data to be interrogated.

The mixture model clustering process fits a mixture model of multivariate Gaussian distribution that best captures the intrinsic relationship between the flow parameters logged for each point in the flow region. The technique can be established on the basis that only two groups/clusters exist in the region of study and this value can be fixed within the mixture model. The clustering process divides the grid points into the two clusters that maximise the difference in flow parameter values between clusters.

Five primitive physical fluid/flow related attributes may be considered in the learning process: density, pressure, and three components of the velocity vector, namely u, v, and w. The 'tied' covariance matrix is used in GMM, such that, in the learning process, VR and non-VR share the same covariance matrix. This common covariance matrix models the intrinsic relationship between the physical quantities of density, pressure and velocity, which is vortex-invariant.

However VR and non-VR groups are distinguished by different mean values of the tested attributes, which is vortex-variant. In this example, a threshold value of the tested attributes can be set as being a predetermined deviation/difference from the mean value of the VR distribution. Upper and/or lower thresholds can be set. A threshold may be set dependent upon the difference between the spacing between the mean values of the VR and non-VR groups. Alternatively the entirety of the points within the distribution for the VR group could be selected, i.e. wherein the threshold(s) represent one or more end point of the distribution. Points/portions of the flow region having values which meet/exceed the threshold value, or lie between threshold values, are recorded as being contained within VR.

Points found to correspond to a VR group for one flow variable may be compared with points found to correspond to a VR group for one or more of the other flow variables. The points found to be common to a plurality of VR groups may be selected as lying within a vortex region for the flow.

The output of this module is the set of points (i.e. locations in the region of study 32) that are clustered into VR by GMM. Whilst non-VR regions may also be identified (i.e. as points/portions of the flow region which do not lie in one or more VR group), these are not used further in this example.

In one example of the invention, once the two groups/clusters of points have been established, the group/cluster showing the highest variance in flow parameter values may be selected as the flow region for further analysis.

A point-based local flow feature identification technique is then performed on the points lying in the flow feature region/cluster identified by process 36. The identification process itself is represented by the steps contained within the box region of FIG. 3 and may be carried out automatically by suitable computing equipment having the relevant machine readable instructions loaded thereon for processing of the point data. This process is repeated for all points lying in the flow feature region (e.g. the VR group) described above, either by iterating each of steps 38, 40 and 42 sequentially for each point or else by performing each step for all points before undertaking the next step. In some examples, depending on the number of points in the flow feature group, further filtering may be performed to extract and process only the most promising subset of points, e.g. to improve computational efficiency. Alternatively the definition of the VR and non-VR groups in the grouping process 36 may be modified to reduce the size of the VR group as necessary.

The vortex identification process is inspired by the primitive understanding that vortices, from data point of view, are typically locally embedded within a 2D plane even within 3D flow fields; and that a vortex point has its neighbour points swirling around it. A swirling motion is reflected by a significant variation in velocity across the set of neighbouring grid points with the vortex point at the centre. The variation in velocity (or components thereof) is highest at a 2D plane that exhibits the most clear swirling motion. This 2D cross-section is sought so as to extract the point and plane that best defines the vortex. This general process is performed by the methodology described below for certain examples of the invention using orthogonal velocity vector components u, v and w at least.

In order to assess the flow regime for a point for a point 'p' in the flow region, the flow field immediately surrounding the point p in 3D is assessed. This is achieved by identifying and assessing the flow parameters of a number of further points that collectively represent the closest 'layer' or volume of the flow surrounding p in order to determine the 2D cross-section of the flow region that best captures the flow behaviour relative to p. The array of further, neighbouring points ideally fully surround point p but may only partially surround p, for example if p lies adjacent a solid surface or other non-flow feature.

The neighbouring points are typically identified as the mesh/grid points that are spatially closest to p. The technique of identifying the neighbouring points may make use of cell information provided by the CFD data to define the adjacent cells and thus the associated points. Additionally/alternatively, the actual location/coordinates of the other points in the flow field may be processed/searched to determine those with the closest proximity to p. Depending on the technique used, the neighbouring point identification process may take points from all cells connected to p or may select points until a predetermined number of neighbouring points has been reached or may select all points lying within a predetermined distance of p.

Regardless of the technique used, the output of the neighbour selection is an array/set of points within the flow feature region associated with p, along with their respective flow parameter values. One example of the pseudo-code for the neighbour selection process is provided below:

Local Neighbour Formation Algorithm Outline
Input: A grid point p in feature region; all cells of the grid from input data
Output: Local neighbour set of the grid point p, nb(p)
1. For a grid point p in feature region
   a. Find all cells C, in which p is one of the connected grid points
   b. Output the union of the grid points in the cells in C excluding p as the neighbour set of p Once the local neighbour set of points corresponding to point p has been established, the 3D to 2D cross-section extraction module 40 automatically determines and extracts a 2D cross-section from the 3D set of neighbour points. This is accomplished by a statistical procedure performed on the flow parameters, e.g. by which flow parameters are converted into principal components. In this particular example, vector flow parameter, i.e. the flow velocities, or orthogonal components thereof are used for statistical processing. The statistical processing is used to search for a plane that is characterized by the highest relative flow parameter, e.g. velocity, variation.

Principal component analysis transforms the input data to a new coordinate system such that the largest variance by any projection of the data comes to lie on the first coordinate (i.e., the first principle component), the second largest variance on the second coordinate, and so on. Hence the analysis is optimized for extracting the subspace that has the biggest variation in the data. Moreover, the outcome is a set of orthogonal vectors, which is suitable to serve as the axes of the new coordinate system in 3D to 2D cross-section extraction. Whilst principal component analysis is described herein as being well suited to plane extraction application, it is noted that other techniques may be used to identify and define the plane in which maximum variance of one or more flow parameter occurs.

For the local neighbour set nb(p) that is returned by the local neighbour formation process 36 described above, the velocity vector of p is subtracted from the velocity vectors of points in nb(p). The statistical analysis is applied on these relative velocity vectors.

Principal component analysis is known to be sensitive to the relative scale of the input variables. Therefore, the relative velocity vectors may be rescaled by their velocity magnitude respectively before feeding into the principal component analysis.

Three principle components are returned during operation of 2D cross-section output module 40. The first two principle components confer the majority of the velocity variation and thus determine the 2D plane being extracted (e.g. defining the orthogonal directions lying in the plane). The third principle component indicates the vector normal to this 2D cross-section.

3D to 2D Cross-Section Extraction—Example Algorithm Outline
Input: Local neighbour set nb(p), each grid points with attributes u-, v-, w-velocity
Output: 2D cross-section centred at p
1. Subtract velocity of p from u-, v-, w-velocity of each grid points in nb(p)
2. Rescale relative u-, v-, w-velocity obtained in Step 1. by velocity magnitude
3. Perform principal component analysis with rescaled relative u-, v-, w-velocity obtained in Step 2.
4. Principal component analysis returns three principle components:
   a. The first two principle components determine the 2D cross-section that carry the biggest data variation
   b. The last principle component is the vector normal to the 2D cross-section
5. Extract 2D section centred at p, based on the normal vector obtained in Step 4b.

In this example, a 2D section that is centred at p, or contains point p, can be extracted based on the normal vector determined by the last principle component, in which the relative velocity vectors in the local neighbour set nb(p) change most dramatically in this 2D cross-section, compared to any other plane. The origin of the coordinate system for the identified plane may or may not be set to p at this point. The direction of the normal vector and/or first and second components define the orientation of the new plane relative to the coordinate system for the flow domain as a whole, e.g. as originally assigned by the CFD data output. Thus the new coordinate system for the identified plane will often, although not always, be offset from the axes of the original coordinate system, depending on the orientation of the vortex or other flow feature under assessment.

Once the plane has been identified, the previous 3D study can be confined to a 2D study of the vortex. In order to assess the flow behaviour relative to, i.e. surrounding, point p within the plane a new set of neighbouring points, i.e. partially or completely surrounding point p need to be defined. That is to say the neighbouring points for p will need to be redefined since they must now lie within the plane of interest, whereas the previous set of neighbouring points were three-dimensional. The new set of neighbouring points may simply comprise the subset of the original 3D neighbouring points that lie within the plane. Additionally or alternatively, the new set of 2D neighbouring points may be interpolated on this 2D cross-section.

A new set of neighbouring points for p within the identified plane could be identified using a hull-based neighbour formation module to define a suitable set of further points in the vicinity of that point. Those further points can then be used to assess whether or not the point p lies within a vortex core. Whilst a specific hull-based example of this module is described below, it will be appreciated that any algorithms capable of identifying and storing a suitable set of neighbouring points for each point in the flow region or VR could be used.

The module 40 forms a neighbourhood for each point in the 2D VR. Herein, the 2D neighbourhood of a point p refers to a set of points in VR that are spaced from p by a distance which lies within one or more threshold distance (i.e. sufficiently close to point p).

This example proposes to use a hull-based neighbourhood formation. It is sufficient to investigate the closest layer of points that cover p from 360° angle, i.e. that substantially surround p where possible, in order to judge if p is a vortex core. The novel vortex recognition method thus requires only a few points around a central point to be assessed in order to make a vortex core judgment, which is localized and all-directional.

The 2D neighbourhood formation may first find the nearest distance d from p to any other point in VR. The distance is defined by the Euclidean distance of point locations. A circle 44 as shown in FIG. 5 can then be defined with p as the center and d as the radius. Then eight landmark points are located on the circle starting at 0 degree of p and with a step of 45 degree of p. Next for each landmark point, the VR point that is the nearest to the landmark point is identified from the available points in the flow field (i.e. at which values of the relevant flow variables are known). The nearest VR points to the landmarks form the neighbourhood of p.

Regardless of which method is used to identify the set of neighbouring points for p, the set is output to the vortex core identification stage 42.

The proposed neighbour formation approach is able to automatically adjust the size of the neighbor set based on the grid density. Furthermore this approach ensures all-direction coverage of p as well as ensuring a good fit for the generally circular/spherical nature of vortices.

The swirling vortex identification module 42 performs velocity angle computation for the neighbourhood of p. It takes the neighbourhood points as input, and uses the three components u, v, and w of the velocity vector for each neighbouring point for velocity angle computation. The output is the velocity angle that accompanies each of the points in the VR group.

The angle may be determined by determining/resolving the resultant direction of motion within the defined two-dimensional plane of the fluid at the relevant point. The velocity angle may be defined with reference to a common direction or axis within the plane which may serve as a datum direction. The angles may be defined in a common direction, i.e. commonly handed in a clockwise or anticlockwise sense, relative the datum direction. Whilst it would also be possible to determine a resultant velocity vector in the plane of interest (i.e. comprising both magnitude and direction) the magnitude of the resultant velocity is less essential to the vortex detection and so it may or may not be determined according to different examples of the invention. The velocity angle has been found to serve as a particularly useful parameter in vortex detection since it is more closely matched to the manner in which visually perceives the presence or absence of a vortex within a fluid flow.

The swirling-based vortex core identification module 42 is responsible for identifying vortex cores by processing the neighbours and their velocity angles for each point in VR. A vortex is determined to exist when particles swirl around a centre (i.e. when a vortex core can be identified by the direction of flow there-about). Therefore, for a vortex core, both the location and the velocity angle of the points around it wind the core by a substantially complete revolution, e.g. 360 degree. The swirling-based vortex core identification module processes every point p in VR as explained below. Alternatively, the module 42 may be performed on a subset of points in VR identified as being most likely candidates based on the 3D analysis. In one example, the module 42 may be run for every point in VR lying within one or more plane previously identified as being a more promising plane (e.g. according to the variation in flow parameter values for that plane). That is to say, some planes could be discarded from the vortex identification stage 42 in order to save computational time, as necessary.

The module 42 orders the points in the neighbourhood of p by their relative position to p. In order to do this, the origin of the coordinate system is changed to p for every point in the neighbourhood (if not already performed above); the coordinate system is then changed from the Cartesian system to the polar coordinate system; and the points in the neighbourhood are ordered by their angular coordinates.

The algorithm computes the velocity angle change, denoted as θ-ch, for every two circularly ordered points in the neighbourhood. The velocity angles may be summed with a common sense, for example such that each value of θ-ch may have a positive or negative value. For example, if there are 3 ordered neighbourhood points, v1, v2, and v3, θ-ch is computed for (v1, v2), (v2, v3), and (v3, v1). Next all θ-ch values are summed up for p, denoted as θ-ch-sum (p). The summation may be taken in sequential order of the points in the neighbourhood, e.g. in a clockwise or anti-clockwise order.

Finally, the points with θ-ch-sum(p) of $2\pi$ (or $-2\pi$) are returned as vortex cores. It has been found that strict adherence to the summation of the velocity angles to $2\pi$ may be a suitable requirement for accurate vortex centre identification. For example a vortex centre may be identified when the summations is within any of 1%, 0.1%, or even 0.01%, depending on the level of accuracy required. It has been found that deviation from the $2\pi$ value for a vortex centre is usually of the order of 0.001%, typically due only to the accuracy with which calculations are performed. In other examples, a threshold of slightly less than 2π may be selected, such as for example 5% or 10% less than 2π as necessary in order to ensure that other, related flow phenomena are caught. In such an example the values of the velocity angle summation may be logged and, if the summation does not equal 2π for any point, then a search may be performed for the value closest to 2π. In any local vicinity or region of the flow domain, this summation may provide useful information about the local flow phenomenon.

An example of a possible algorithm outline for module 42 is given below:

2D Swirling Vortex Identification—Algorithm Outline

Input: New sets of grid points on 2D cross-section centred at p, each with X-, Y-, Z-coordinate and u-, v-, w-velocity relative to p Output: A binary yes-no to indicate if grid point p is identified as vortex point
1. Find the grid points that are directly connected to p, denoted as NewNeighbourSet(p)
2. Order the grid points in NewNeighbourSet(p) by their relative position to p
3. Compute relative velocity angle change (θ-ch) for every two circularly ordered points in NewNeighbourSet(p)
4. Sum up all θ-ch for p as θ-ch-sum(p)
5. Identify p as vortex point if θ-ch-sum(p)=2π

The proposed swirling-based vortex core identification has several advantages. It is able to identify precisely vortex cores. The high precision comes from a sufficient and necessary condition for vortex core: the swirling angle of the surrounding points accumulates to 2π. Furthermore it does not require any user-input parameters to tailor the tool to suit specific flow conditions. In other examples, different definitions of flow phenomenon may be used to identify other flow features of interest, i.e. by reducing the angular summation threshold to below 27 and/or looking for a different relative flow behaviour in the neighbourhood of p.

In the examples described above, the selection of the number and/or distance of points to be included in p's neighbourhood in 2D and/or 3D may not be arbitrary. Selection of a suitable number of points to include in a neighbourhood is an important consideration since increasing the number of points may incur high computational cost. Conversely, the use of too few points could fail to correctly identify a vortex core or other flow feature.

In any of the above-described examples of the invention, one or more further vortex characteristic may be determined, such as a vortex length/width dimension. A distance from the vortex core to one or more outlying points within the vortex may be determined.

Turning back to the examples of FIGS. 1 and 2, if a vortex is identified that is adjacent or impinging upon the fluid washed surface of the component under analysis, changes in the component geometry can be implemented to determine the changes in the flow pattern and whether those changes cause the vortex core to move away from the component surface. Additionally or alternatively, if a vortex core or other unwanted flow-loss-inducing feature appears in an unsuitable region of the flow, the geometry can be adjusted to move or reduce the flow feature as necessary. Thus a variety of different geometries may be explored to determine the impact on the formation of one or more flow feature and its location. Thus a preferred geometry can be selected for implementation in which the impact of vortices on flow efficiency have been eliminated or reduced as far as possible under other stipulated operational/geometric constraints. The selected geometry may be taken forward to manufacture.

In any examples, the plane of the point p, determined to lie at the heart of a flow feature, can be used to characterise the flow feature, e.g. along with measurements of the flow feature taken within that plane. This allows meaningful comparison of different flow features in a standardised format which is particularly useful for a product designer to be able to compare flow features, regimes and associated product/system geometries.

The data reduction from 3D to 2D analysis of flow phenomena is particularly beneficial since it can significantly increase the ability to visualise and assess flow behaviour. However this problem has represented a significant challenge and the automated detection of 2D planes representative of vortices or other flow features has to-date not been satisfactorily resolved by experts in the field of computational fluid dynamics. The invention allows detection and characterisation of vortices and other flow phenomena in a way that can detect the phenomena in instances that may otherwise have been missed. The invention may boost vortex detection efficiency whilst also allowing a tool that can be operated on the entire flow field automatically, i.e. without requiring expert guidance to achieve acceptable results.

The invention claimed is:

1. A computer implemented fluid flow feature detection method comprising:
  establishing a computational fluid dynamics simulation of fluid flow on a computer;
  identifying a plurality of points at locations over a three-dimensional flow region of the simulated flow in which the flow feature detection is to be performed;
  storing, for each point, a value for one or more fluid flow parameters;
  grouping the points in one of a flow feature group and a remaining non-flow feature group of the flow region according to a distribution of the points based on a mixture model applied to the values of the one or more fluid flow parameters of the points;
  identifying a point within the flow feature group and a plurality of further points at least partially surrounding the identified point;
  determining a two-dimensional plane in which a strongest fluid flow feature is identified based on the relative values of the one or more fluid flow parameters for the plurality of further points, the two-dimensional plane having a maximum variance of one or more fluid flow parameters and including a maximum value of the fluid flow, the two-dimensional plane being determined using a statistical search processing;
  outputting an array of points including (i) the identified point grouped in the flow feature group and (ii) the plurality of further points surrounding the identified point, which are each located on the determined two-dimensional plane, that identify a location of the fluid flow feature on a surface of a fluid-washed component; and
  designing a surface geometry of the fluid-washed component for manufacturing of the fluid-washed component based on the array of points, and repeating steps of the method until the identified location of the fluid flow feature based on the array of point's changes in a direction normal to the surface of the fluid-washed component.

2. The flow feature detection method according to claim 1, wherein the one or more flow parameters within the plane are determined and stored to be a characteristic of the flow feature.

3. The flow feature detection method according to claim 1, wherein the plane is determined to be the plane through the flow feature group for which the identified point and the plurality of further points displays a greatest variation in values of the one or more flow parameters.

4. The flow feature detection method according to claim 1, wherein the value of the one or more flow parameters for the identified point is subtracted from the value of the one or more flow parameters for each further point.

5. The flow feature detection method according to claim 1, wherein the one or more flow parameters include a flow velocity vector, or a component of the flow velocity vector in an axial direction of a Cartesian coordinate system for the flow region.

6. The flow feature detection method according to claim 1, wherein the determining of the plane in which the flow feature is identifiable is repeated for each point within the flow feature group.

7. The flow feature detection method according to claim 1, wherein the flow feature is a flow feature inducing a loss of energy from the flow.

8. The flow feature detection method according to claim 1, wherein the plurality of further points include the array of points that closely surround or neighbour the identified point.

9. The flow feature detection method according to claim 1, wherein the plurality of further points include a two or three-dimensional array of points centred about the identified point.

10. The flow feature detection method according to claim 1, wherein a three-dimensional array identifies the plane, and a two-dimensional array of the plurality of further points identifies a location or characteristic of the flow feature within the plane.

11. The flow feature detection method according to claim 1, wherein a statistical analysis of the one or more flow parameters of each of the further points is performed to identify the plane.

12. The flow feature detection method according to claim 1, wherein a statistical analysis for the plurality of points over the flow region according to a probability distribution of the flow parameters is used to group the plurality of points into the flow feature group or the remaining non-flow feature group of the flow region.

13. The flow feature detection method according to claim 1, wherein an angular orientation of the plane relative to one or more axes of a Cartesian coordinate system for the flow region is determined according to a fluid flow vector.

14. The flow feature detection method according to claim 1, wherein a relative direction of motion of the plurality of further points determines the plane and a location of the flow feature within the plane.

15. The flow feature detection method according to claim 1, wherein a change in velocity angle between each further point and an adjacent further point is determined and an aggregate of the changes in velocity angle for all of the further points about the identified point determine whether the identified point is located within the flow feature.

16. The flow feature detection method according to claim 15, wherein the changes in velocity angle are calculated for the plurality of further points lying within the determined plane.

17. A method of designing or modifying a geometry of a component washed by fluid within a region of fluid flow, the method comprising performing the flow feature detection method according to claim 1, and modifying the geometry of the fluid washed component to alter the flow feature.

18. A non-transitory computer readable storage medium storing machine readable instructions to control one or more processors to:
establish a computational fluid dynamics simulation of fluid flow on a computer;
access one or more data files stored on the computer containing fluid flow parameter data identifying a plurality of points at locations over a three-dimensional flow region of simulated flow in which a flow feature detection is to be performed;
store, for each point, a value for one or more fluid flow parameters;
group the points in one of a flow feature group and a remaining non-flow feature group of the flow region according to a distribution of the points based on a mixture model applied to the values of the one or more fluid flow parameters of the points;
identify a point within the flow feature group and a plurality of further points at least partially surrounding the identified point;
determine a two-dimensional plane in which a strongest fluid flow feature is identified based on the relative values of the one or more fluid flow parameters for the plurality of further points, the two-dimensional plane having a maximum variance of one or more fluid flow parameters and including a maximum value of the fluid flow, the two-dimensional plane being determined using a statistical search processing;
output an array of points including (i) the identified point grouped in the flow feature group and (ii) the plurality of further points surrounding the identified point, which are each located on the determined two-dimensional plane, that identify a location of the fluid flow feature on a surface of a fluid-washed component; and
design a surface geometry of the fluid-washed component for manufacturing of the fluid-washed component based on the array of points, and repeat the steps of the method until the identified location of the fluid flow feature based on the array of points changes in a direction normal to the surface of the fluid-washed component.

19. A vortex detection tool comprising:
a memory storing location data for a plurality of points over a three-dimensional fluid flow region of a computational fluid dynamics simulation of flow in which vortex detection is to be performed, and a plurality of fluid flow parameter values at each of the plurality of points; and one or more processors configured to:
establish the computational fluid dynamics simulation of fluid flow on a computer;
group the points in one of a vortical flow group and a non-vortical flow group of the flow region according to a distribution of the points based on a mixture model applied to the values of the fluid flow parameters of the points;
identify a first point in a vortex core of the vortical flow group and a plurality of further points at least partially surrounding the identified point;
determine a two-dimensional plane in which a strongest fluid flow feature is identified based on the relative values of at least one of the one or more fluid flow parameters for the plurality of further points, the two-dimensional plane having a maximum variance of one or more fluid flow parameters and including a maximum value of the fluid flow, the two-dimensional plane being determined using a statistical search processing;

output an array of points including (i) the identified point grouped in the vortical flow group and (ii) the plurality of further points surrounding the identified point, which are each located on the determined two-dimensional plane, that identify a location of the fluid flow feature on a surface of a fluid-washed component; and design a surface geometry of the fluid-washed component for manufacturing of the fluid-washed component based on the array of points, and repeat the steps of the method until the identified location of the fluid flow feature based on the array of points changes in a direction normal to the surface of the fluid-washed component.

* * * * *